(12) United States Patent
Cooney et al.

(10) Patent No.: US 10,658,819 B1
(45) Date of Patent: May 19, 2020

(54) ALTERNATING CURRENT BUSSING CONNECTOR

(71) Applicant: Hamilton Sundstrand Corporation, Charlotte, NC (US)

(72) Inventors: Robert C. Cooney, Janesville, WI (US); Jeffrey T. Wavering, Rockford, IL (US); Nhia Yang, Loves Park, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/270,318

(22) Filed: Feb. 7, 2019

(51) Int. Cl.
| H02B 1/20 | (2006.01) |
| H05K 7/02 | (2006.01) |
| H02M 5/27 | (2006.01) |
| H02G 5/00 | (2006.01) |

(52) U.S. Cl.
CPC .................. *H02B 1/20* (2013.01); *H02G 5/00* (2013.01); *H02M 5/271* (2013.01); *H05K 7/026* (2013.01)

(58) Field of Classification Search
CPC .. H01H 2085/2055; H02G 5/00; H02G 5/005; H02M 5/271; H05K 7/026; H05K 2201/10272; H05K 2201/1028
See application file for complete search history.

(56) References Cited

U.S. PATENT DOCUMENTS

| | | | |
|---|---|---|---|
| 3,328,647 A * | 6/1967 | Gryctko | H01R 9/00 361/673 |
| 5,909,367 A | 6/1999 | Change | |
| 8,482,904 B2 | 7/2013 | Darroman et al. | |
| 2001/0003070 A1* | 6/2001 | Asao | H01R 9/2425 439/76.2 |
| 2002/0053456 A1* | 5/2002 | Nishida | H02G 5/002 174/70 B |
| 2009/0023345 A1* | 1/2009 | Matsumoto | H01R 13/42 439/720 |
| 2010/0039789 A1* | 2/2010 | Mason | H01H 85/20 361/833 |
| 2014/0000927 A1* | 1/2014 | Hashimoto | H02G 5/005 174/68.2 |
| 2014/0116751 A1* | 5/2014 | Hatori | H02M 7/003 174/129 B |
| 2014/0216780 A1* | 8/2014 | Yanniello | H02G 5/06 174/95 |
| 2014/0293516 A1* | 10/2014 | Swift | H02B 1/20 361/624 |
| 2016/0064881 A1* | 3/2016 | Yanniello | H02B 1/56 439/207 |
| 2019/0157981 A1* | 5/2019 | Steinberger | H02M 7/003 |

* cited by examiner

*Primary Examiner* — Jacob R Crum
(74) *Attorney, Agent, or Firm* — Cantor Colburn LLP

(57) ABSTRACT

A bussing connector is provided and includes bus bar connections, output elements and dielectric material. The bus bar connections each include an output section and an input section. The input sections cooperatively form a multiphase alternating current (AC) input. The output elements are arranged along and in electrical communication with the output sections of each of the bus bar connections. The dielectric material is configured to partially surround and partially electrically insulate the input and output sections and the output elements of each of the bus bar connections. The dielectric material is further configured to expose the multiphase AC input and portions of each of the outlet elements of each of the bus bar connections.

18 Claims, 3 Drawing Sheets

ALTERNATING CURRENT BUSSING CONNECTOR

BACKGROUND

The following description relates to bussing connectors and, more particularly, to a three-phase alternating current (AC) bussing connector.

A typical power panel wiring configuration for high-current applications uses individual wires that are routed and provided as a three-phase bundle. The wires are crimped to contacts and "daisy-chained" from one contact to the next to create an AC bus in order to electrically connect multiple modules together. While this process results in multiple connected modules, it also results in increased voltage drops between sequential connection points. The process is also labor intensive with highly variable results.

BRIEF DESCRIPTION

According to an aspect of the disclosure, a bussing connector is provided and includes bus bar connections, output elements and dielectric material. The bus bar connections each include an output section and an input section. The input sections cooperatively form a multiphase alternating current (AC) input. The output elements are arranged along and in electrical communication with the output sections of each of the bus bar connections. The dielectric material is configured to partially surround and partially electrically insulate the input and output sections and the output elements of each of the bus bar connections. The dielectric material is further configured to expose the multiphase AC input and portions of each of the outlet elements of each of the bus bar connections.

In accordance with additional or alternative embodiments, the bus bar connections are arranged in a side-by-side arrangement.

In accordance with additional or alternative embodiments, the side-by-side arrangement is characterized in that one bus bar connection is interposed between the other bus bar connections, each of the output sections includes an elongate body, each of the input sections includes an input body that flares outwardly from the elongate body and each of the input sections of each of the other bus bar connections accommodate outward flaring of the input body of the one bus bar connection.

In accordance with additional or alternative embodiments, each of the input sections of each of the bus bar connections includes a fastener.

In accordance with additional or alternative embodiments, the multiple output elements arranged along the output sections of each of the bus bar connections form multiple linear three-phase output element groups.

In accordance with additional or alternative embodiments, the multiple linear three-phase output element groups are parallel with one another.

In accordance with additional or alternative embodiments, the multiple linear three-phase output element groups are each separated from a neighboring linear three-phase output element group by a same distance.

In accordance with additional or alternative embodiments, the dielectric material includes elongate elements interposed between neighboring pairs of the bus bar connections and plugs that surround linear three-phase output element groups.

According to an aspect of the disclosure, a bussing connector is provided and includes first, second and third bus bar connections, multiple output elements and dielectric material. The first, second and third bus bar connections each include output sections and input sections cooperatively forming a three-phase alternating current (AC) input. The multiple output elements are arranged along and in electrical communication with the output sections of each of the first, second and third bus bar connections. The dielectric material is configured to partially surround and partially electrically insulate the input and output sections and the multiple output elements of each of the first, second and third bus bar connections. The dielectric material is further configured to expose the three-phase AC input and portions of each of the multiple outlet elements of each of the first, second and third bus bar connections.

In accordance with additional or alternative embodiments, the first, second and third bus bar connections are arranged in a side-by-side arrangement.

In accordance with additional or alternative embodiments, the side-by-side arrangement is characterized in that the second bus bar connection is interposed between the first and third bus bar connections, each of the output sections comprises an elongate body, each of the input sections includes an input body that flares outwardly from the elongate body and each of the input sections of each of the first and third bus bar connections accommodate outward flaring of the input body of the second bus bar connection.

In accordance with additional or alternative embodiments, each of the input sections of each of the first and third bus bar connections includes a fastener.

In accordance with additional or alternative embodiments, the multiple output elements arranged along the output sections of each of the first, second and third bus bar connections form multiple linear three-phase output element groups.

In accordance with additional or alternative embodiments, the multiple linear three-phase output element groups are parallel with one another.

In accordance with additional or alternative embodiments, the multiple linear three-phase output element groups are each separated from a neighboring linear three-phase output element group by a same distance.

In accordance with additional or alternative embodiments, the dielectric material includes elongate elements interposed between neighboring pairs of the first, second and third bus bar connections and plugs that surround linear three-phase output element groups.

According to another aspect of the disclosure, a power wiring configuration is provided and includes a circuit board including input connectors, three-phase panel bus bars and a three-phase bussing connector. The three-phase bussing connector includes internal bus bar connections and multiple output elements arranged along and in electrical communication with each of the internal bus bar connections and dielectric material partially surrounding and partially electrically insulating the internal bus bar connections and the multiple output elements. The internal bus bar connections are respectively connectable with the three-phase panel bus bars at a three-phase alternating current (AC) input and the multiple output elements are respectively connectable in three-phase groups with each of the input connectors.

In accordance with additional or alternative embodiments, the power wiring configuration further includes a panel on which the three-phase bussing connector is disposable.

In accordance with additional or alternative embodiments, the power wiring configuration further includes fasteners by which each internal bus bar connection is connectable with a corresponding one of the 3-phase panel bus bars at the three-phase AC input.

In accordance with additional or alternative embodiments, the dielectric material includes elongate elements interposed between neighboring pairs of the internal bus bar connections and plugs that surround the multiple output elements in corresponding ones of the three-phase groups.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

These and other advantages and features will become more apparent from the following description taken in conjunction with the drawings.

DETAILED DESCRIPTION

As will be described below, a three-phase AC bussing connector is provided. The three-phase bussing connector includes internal bus bar connections that are connected to input and module connections. Dielectric material is provided as a cover to maintain spacing.

Figure 1:
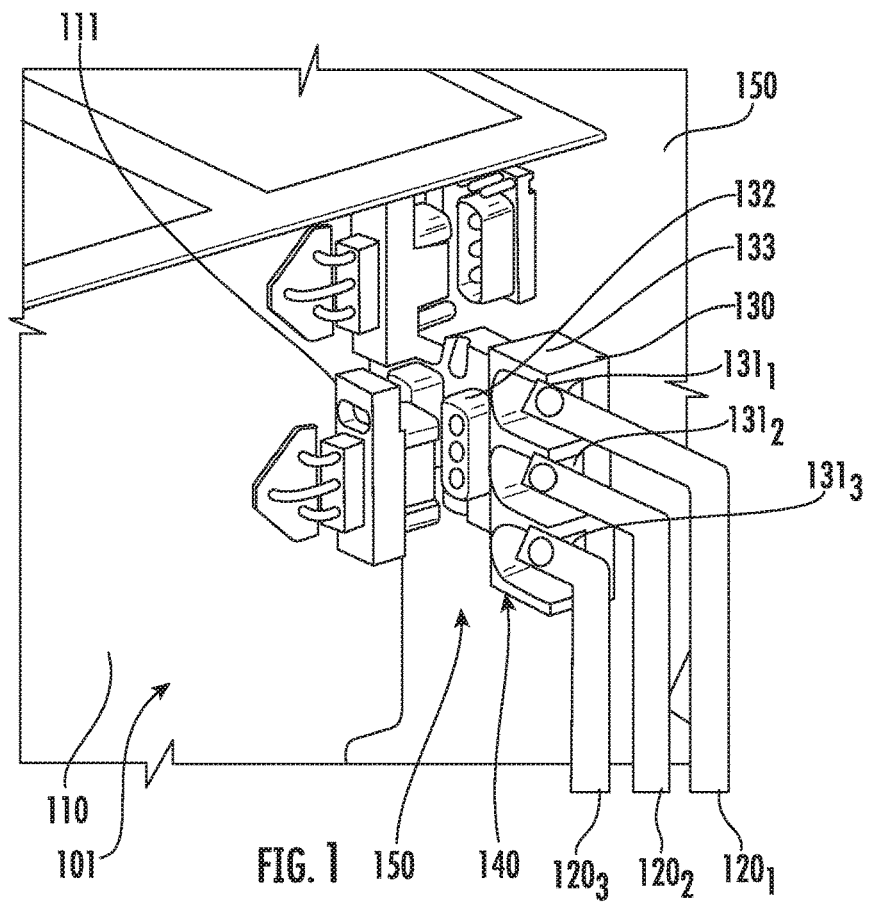
FIG. 1 is a perspective view of a three-phase alternating current (AC) bussing connector of a power panel wiring configuration in accordance with embodiments.
Figure 2:
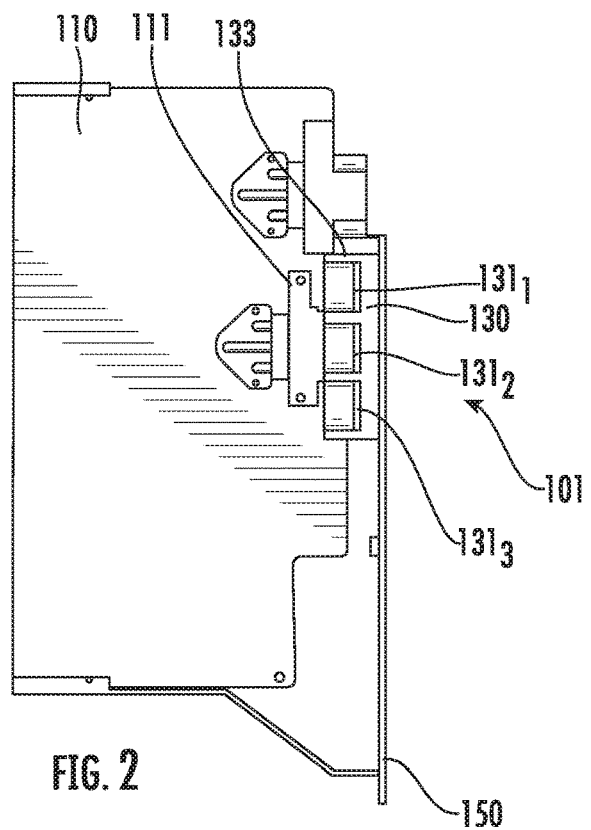
FIG. 2 is a side view of the three-phase AC bussing connector of FIG. 1 without input bars.

With reference to FIGS. 1 and 2, a power wiring configuration 101 is provided and includes a circuit board 110 that includes input connectors 111, three-phase panel bus bars $120_k$, $120_2$ and $120_3$ and a three-phase bussing connector 130. The three-phase bussing connector 130 includes internal bus bar connections $131_1$, $131_2$ and $131_3$, multiple output elements 132 arranged along and in electrical communication with each of the internal bus bar connections $131_1$, $131_2$ and $131_3$ and dielectric material 133. The dielectric material 133 partially surrounds and partially electrically insulates each of the internal bus bar connections $131_1$, $131_2$ and $131_3$ and each of the multiple output elements 132. As shown in FIG. 1, each of the internal bus bar connections $131_1$, $131_2$ and $131_3$ is respectively connectable with a corresponding one of the three-phase panel bus bars $120_1$, $120_2$ and $120_3$ at a multiphase or three-phase alternating current (AC) input 140 that is cooperatively formed by the internal bus bar connections $131_1$, $131_2$ and $131_3$. The multiple output elements 132 are respectively connectable in three-phase groups 150 with each of the input connectors 111.

In accordance with embodiments, the power wiring configuration 101 can further include a panel 150 on which the three-phase bussing connector 130 is disposable. In accordance with further embodiments and as shown in FIG. 2, the panel 150, as part of a power distribution panel, can be secured to the circuit board 110 and may be oriented substantially perpendicularly with respect to the circuit board 110.

Figure 3:
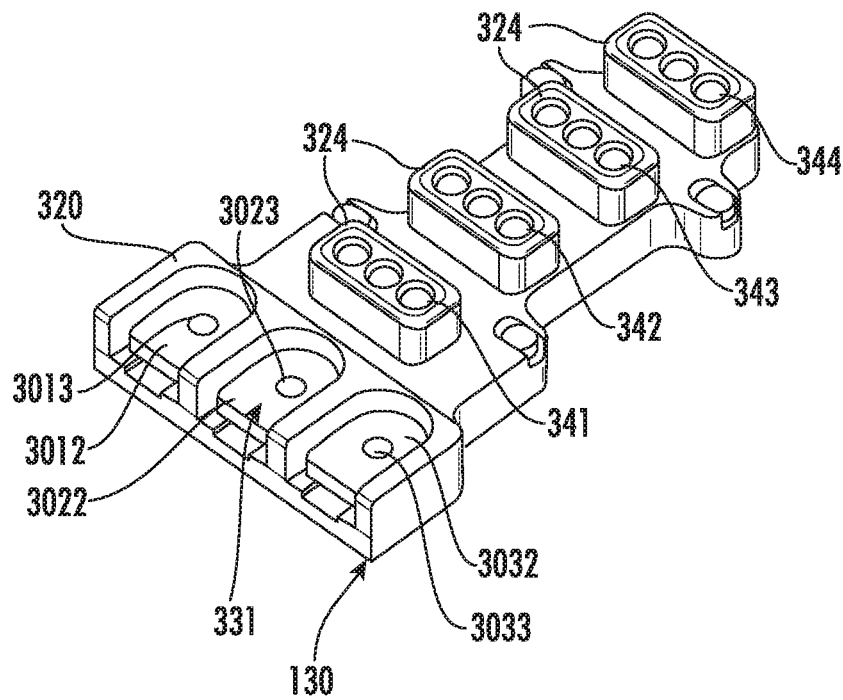
FIG. 3 is a perspective view of the three-phase AC bussing connector of FIG. 1.
Figure 4:
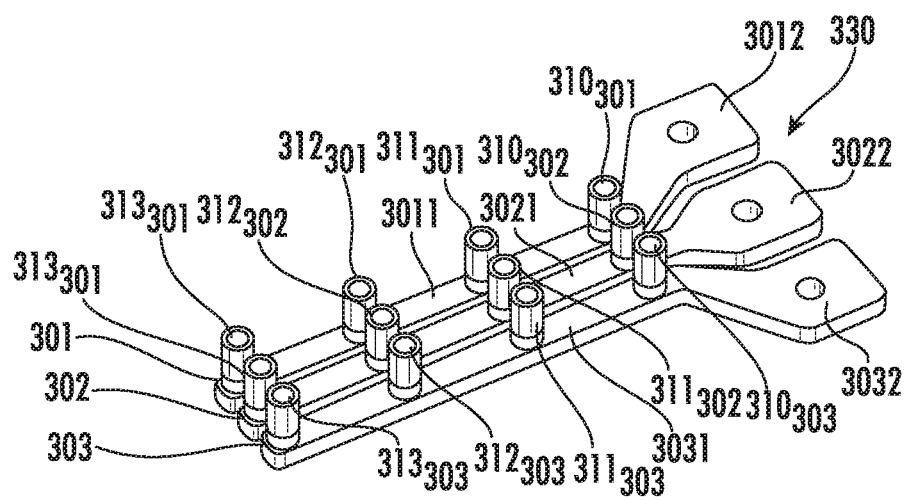
FIG. 4 is a perspective view of first, second and third bus bar connections and multiple output elements of the three-phase AC bussing connector of FIG. 3.
Figure 5:
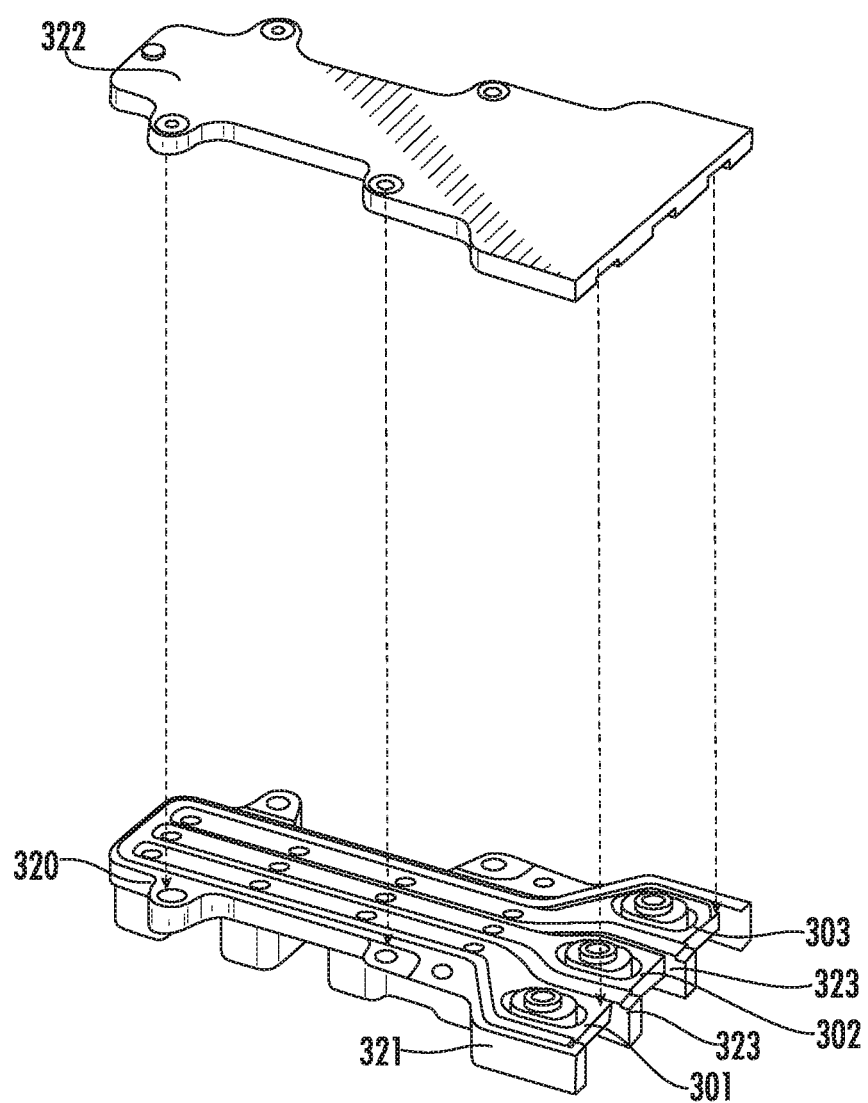
FIG. 5 is a perspective view of first, second and third bus bar connections and dielectric material of the three-phase AC bussing connector of FIG. 3.

With reference to FIGS. 3-5, the three-phase bussing connector 130 includes first, second and third internal bus bar connections 301, 302 and 303 (see FIG. 4), multiple outlet elements $310_{301}$, $310_{302}$, $310_{303}$, $311_{301}$, $311_{302}$, $311_{303}$, $312_{301}$, $312_{302}$, $312_{303}$, $313_{301}$, $313_{302}$ and $313_{303}$ (See FIG. 4) and dielectric material 320.

The first internal bus bar connection 301 has an output section 3011 and an input section 3012, the second internal bus bar connection 302 has an output section 3021 and an input section 3022 and the third internal bus bar connection 303 has an output section 3031 and an input section 3032. The first, second and third internal bus bar connections 301, 302 and 303 are arranged in a side-by-side formation 330 (see FIG. 4) such that the input sections 3012, 3022 and 3032 cooperatively form a multiphase or three-phase alternating current (AC) input 331 (see FIG. 3). The multiple output elements $310_{301}$, $311_{301}$, $312_{301}$ and $313_{301}$ are arranged along and in electrical communication with the output section 3011 of the first internal bus bar connection 301, the multiple output elements $310_{302}$, $311_{302}$, $312_{302}$ and $313_{302}$ are arranged along and in electrical communication with the output section 3021 of the second internal bus bar connection 302 and the multiple output elements $310_{303}$, $311_{303}$, $312_{303}$ and $313_{303}$ are arranged along and in electrical communication with the output section 3031 of the third internal bus bar connection 303.

The input section 3012 of the first internal bus bar connection 301 includes a fastener 3013 by which the first internal bus bar connection 301 is connectable with the three-phase panel bus bar $120_1$ (see FIG. 1), the input section 3022 of the second internal bus bar connection 302 includes a fastener 3023 by which the second internal bus bar connection 302 is connectable with the three-phase panel bus bar $120_2$ (see FIG. 1) and the input section 3032 of the third internal bus bar connection 303 includes a fastener 3033 by which the third internal bus bar connection 303 is connectable with the three-phase panel bus bar $120_3$ (see FIG. 1).

The dielectric material 320 is configured to partially surround and to partially electrically insulate the output section 3011 and the input section 3012 and the multiple output elements $310_{301}$, $311_{301}$, $312_{301}$ and $313_{301}$ of the first bus bar connection 301, to partially surround and to partially electrically insulate the output section 3021 and the input section 3022 and the multiple output elements $310_{302}$, $311_{302}$, $312_{302}$ and $313_{302}$ of the second bus bar connection 302 and to partially surround and to partially electrically insulate the output section 3031 and the input section 3032 and the multiple output elements $310_{303}$, $311_{303}$, $312_{303}$ and $313_{303}$ of the third bus bar connection 303. The dielectric material 320 is further configured to expose the three-phase AC input 331 and to expose portions of the multiple output elements $310_{301}$, $311_{301}$, $312_{301}$, $313_{301}$ of the first bus bar connection 301, portions of the multiple output elements $310_{302}$, $311_{302}$, $312_{302}$ and $313_{302}$ of the second bus bar connection 302 and portions of the multiple output elements $310_{303}$, $311_{303}$, $312_{303}$ and $313_{302}$ of the third bus bar connection 303.

In accordance with embodiments and as shown in FIG. 4, the side-by-side formation 330 may be characterized in that the second bus bar connection 302 is interposed between the first bus bar connection 301 and the third bus bar connection 303, each of the output sections 3011, 3021 and 3031 includes an elongate body, each of the input sections 3012, 3022 and 3032 includes an input body that flares outwardly from the elongate body and each of the input sections 3012 and 3032 of the first and third bus bar connections 301 and 303 accommodates the outward flaring of the input body of the input section 3022 of the second bus bar connection 302.

In accordance with embodiments and as shown in FIGS. 3 and 4, the output element $310_{301}$, the output element $310_{302}$ and the output element $310_{303}$ may be arranged along the first, second and third internal bus bar connections 301, 302 and 303, respectively, in a first linear three-phase group 341, the output element $311_{301}$, the output element $311_{302}$ and the output element $311_{303}$ may be arranged along the first, second and third internal bus bar connections 301, 302 and 303, respectively, in a second linear three-phase group 342, the output element $312_{301}$, the output element $312_{302}$ and the output element $312_{303}$ may be arranged along the first, second and third internal bus bar connections 301, 302 and 303, respectively, in a third linear three-phase group 343 and the output element $313_{301}$, the output element $313_{302}$ and the output element $313_{303}$ may be arranged along the first, second and third internal bus bar connections 301, 302 and 303, respectively, in a fourth linear three-phase group 343. The first, second, third and fourth linear three-phase groups 341, 342, 343 and 344 may be substantially parallel with one another and separated from a neighboring group by a substantially same distance.

As shown in FIGS. 3 and 5, the dielectric material 320 includes an exterior cover 321 (see FIG. 5), a back cover 322 (see FIG. 5) that is attachable to flanges of the exterior cover 321, elongate elements 323 (see FIG. 5) and plugs 324 (see FIG. 3). The elongate elements 323 are encompassed within the exterior cover 321 and extend between the first and second internal bus bar connections 301 and 302 and between the second and third internal bus bar connections 302 and 303. The elongate elements 323 thus electrically insulate each of the first, second and third internal bus bar connections 301, 302 and 303. The plugs 324 surround each of the first, second, third and fourth three-phase groups 341, 342, 343 and 344 and are configured to engage with the input connectors 111 (see FIG. 1).

With the configurations described herein, three-phase AC current can be received by the first, second and third internal bus bar connections 301, 302 and 303 at the three-phase AC input 331. The first, second and third internal bus bar connections 301, 302 and 303 are thus capable of transmitting that current to their corresponding outlet elements in the first, second, third and fourth linear three-phase groups 341, 342, 343 and 344. Each of the first, second, third and fourth linear three-phase groups 341, 342, 343 and 344 then respectively transmit three-phase AC current to the input connectors 111 of FIG. 1.

Although the description provided above relates generally to three-phase AC current, the three-phase bussing connector 130 can be modified by a person of ordinary skill in the art and in accordance with alternative embodiments to be compatible with greater or fewer phases of AC current. Further, the three-phase bussing connector 130 can be modified by a person of ordinary skill in the art and in accordance with alternative embodiments to be compatible with greater or fewer phases of DC current.

Technical effects and benefits of the features described herein are the distribution of power to multiple power modules within a power panel, the control of voltage drops to multiple module positions and minimized assembly labor.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A bussing connector, comprising:
   bus bar connections each comprising an output section and an input section, the input sections cooperatively forming a multiphase alternating current (AC) input;
   output elements arranged along and in electrical communication with the output sections of each of the bus bar connections; and
   dielectric material configured to partially surround and partially electrically insulate the input and output sections and the output elements of each of the bus bar connections,
   the dielectric material being further configured to expose the multiphase AC input and portions of each of the outlet elements of each of the bus bar connections,
   wherein the dielectric material comprises elongate elements interposed between neighboring pairs of the bus bar connections and plugs that surround linear three-phase output element groups.

2. The bussing connector according to claim 1, wherein the bus bar connections are arranged in a side-by-side arrangement.

3. The bussing connector according to claim 2, wherein:
   the side-by-side arrangement is characterized in that one bus bar connection is interposed between the other bus bar connections,
   each of the output sections comprises an elongate body,
   each of the input sections comprises an input body that flares outwardly from the elongate body, and
   each of the input sections of each of the other bus bar connections accommodate outward flaring of the input body of the one bus bar connection.

4. The bussing connector according to claim 1, wherein each of the input sections of each of the bus bar connections comprises a fastener.

5. The bussing connector according to claim 1, wherein the multiple output elements arranged along the output sections of each of the bus bar connections form multiple linear three-phase output element groups.

6. The bussing connector according to claim 5, wherein the multiple linear three-phase output element groups are parallel with one another.

7. The bussing connector according to claim 5, wherein the multiple linear three-phase output element groups are each separated from a neighboring linear three-phase output element group by a same distance.

8. A bussing connector, comprising:
   first, second and third bus bar connections each comprising output sections and input sections cooperatively forming a three-phase alternating current (AC) input;
   multiple output elements arranged along and in electrical communication with the output sections of each of the first, second and third bus bar connections; and dielectric material configured to partially surround and partially electrically insulate the input and output sections and the multiple output elements of each of the first, second and third bus bar connections, the dielectric material being further configured to expose the three-phase AC input and portions of each of the multiple outlet elements of each of the first, second and third bus bar connections, wherein the dielectric material comprises elongate elements interposed between neighboring pairs of the first, second and third bus bar connections and plugs that surround linear three-phase output element groups.

9. The bussing connector according to claim 8, wherein the first, second and third bus bar connections are arranged in a side-by-side arrangement.

10. The bussing connector according to claim 9, wherein:
the side-by-side arrangement is characterized in that the second bus bar connection is interposed between the first and third bus bar connections,
each of the output sections comprises an elongate body,
each of the input sections comprises an input body that flares outwardly from the elongate body, and
each of the input sections of each of the first and third bus bar connections accommodate outward flaring of the input body of the second bus bar connection.

11. The bussing connector according to claim 8, wherein each of the input sections of each of the first and third bus bar connections comprises a fastener.

12. The bussing connector according to claim 8, wherein the multiple output elements arranged along the output sections of each of the first, second and third bus bar connections form multiple linear three-phase output element groups.

13. The bussing connector according to claim 12, wherein the multiple linear three-phase output element groups are parallel with one another.

14. The bussing connector according to claim 12, wherein the multiple linear three-phase output element groups are each separated from a neighboring linear three-phase output element group by a same distance.

15. A power wiring configuration, comprising:
a circuit board comprising input connectors;
three-phase panel bus bars; and
a three-phase bussing connector comprising internal bus bar connections and multiple output elements arranged along and in electrical communication with each of the internal bus bar connections and dielectric material partially surrounding and partially electrically insulating the internal bus bar connections and the multiple output elements,
the internal bus bar connections being respectively connectable with the three-phase panel bus bars at a three-phase alternating current (AC) input, and
the multiple output elements being respectively connectable in three-phase groups with each of the input connectors.

16. The power wiring configuration according to claim 15, further comprising a panel on which the three-phase bussing connector is disposable.

17. The power wiring configuration according to claim 15, further comprising fasteners by which each internal bus bar connection is connectable with a corresponding one of the 3-phase panel bus bars at the three-phase AC input.

18. The power wiring configuration according to claim 15, wherein the dielectric material comprises:
elongate elements interposed between neighboring pairs of the internal bus bar connections; and
plugs that surround the multiple output elements in corresponding ones of the three-phase groups.

* * * * *